United States Patent [19]

Ban et al.

[11] Patent Number: 4,500,789
[45] Date of Patent: Feb. 19, 1985

[54] ELECTRON BEAM EXPOSING METHOD

[75] Inventors: Yasutaka Ban, Yokohama; Toshihiko Osada, Ebina, both of Japan

[73] Assignee: Fujitsu Limited, Kawasaki, Japan

[21] Appl. No.: 411,316

[22] Filed: Aug. 25, 1982

[30] Foreign Application Priority Data

Aug. 26, 1981 [JP] Japan ................................. 56-134598

[51] Int. Cl.³ ............................................ A61K 27/02
[52] U.S. Cl. ................................ 250/492.2; 250/358; 430/296
[58] Field of Search ............................. 250/398, 492.2; 430/296

[56] References Cited

U.S. PATENT DOCUMENTS 4,169,230 9/1979 Bohlen et al. ..................... 250/492.2
4,264,711 4/1981 Greeneich ........................... 430/296
4,295,048 10/1981 Cleland et al. ................... 250/492.2

Primary Examiner—Bruce C. Anderson
Attorney, Agent, or Firm—Staas & Halsey

[57] ABSTRACT

When an electron beam is projected onto a desired pattern region, the acceleration voltage of the electron beam is set at a value at which the distribution of the scattered electrons in a predetermined region is substantially uniform. The exposure dosage is determined according to the ratio between the total area of the patterns to which the electron beam is projected in the predetermined region and the area of the predetermined region. The exposure time of the electron beam is determined in dependence upon a dose amount and the electron beam current. The exposure time of the electron beam is changed when pattern data is changed and a correction factor is calculated accordingly.

3 Claims, 4 Drawing Figures

ELECTRON BEAM EXPOSING METHOD

BACKGROUND OF THE INVENTION

The present invention relates to an electron beam-exposing method. More particularly, it relates to a method for exposing workpieces to an electron beam which is capable of describing fine patterns with high precision.

In a vector-scanning technique, an electron beam addresses only the pattern areas requiring exposure. A usual approach is to decompose the pattern into a series of simple shapes, such as rectangles and parallelograms. Vector scanning is usually more efficient than raster scanning but requires a higher performance-deflection system. In addition, it has several other advantages which raster scanning does not. For instance, ease of correction of the proximity effects of electron scattering and a significant compacting of data that leads to a much simpler control system.

Proximity effects are created by scattered electrons in the resist and by reflected electrons from the substrate. The electrons partially expose the resist up to several micrometers from the point of impact. As a result, a serious variation of exposure occurs over the pattern area when pattern geometries fall within the micrometer and submicrometer range.

To precisely describe fine patterns by exposing a substrate to an electron beam, the effect of the scattered electrons and the reflected electrons must be satisfactorily corrected. Therefore, heretofore, both the exposure dosage and the pattern size to be exposed has to be corrected when a predetermined pattern was to be described by the exposure of electron beams on a resist formed on a substrate, such as a semiconductor substrate or a mask substrate that was to be treated.

When an electron beam, accelerated at a voltage of about 20 to 25 kV, is projected onto a substrate, the electrons reflected by the substrate are scattered around an incidence point were incident electrons fall. It is known that the scattering radius of the reflected electrons is about 2.5 $\mu$m when a voltage within the above-mentioned range is applied.

The scattering radius is nearly equal to the pattern dimensions and pattern gaps of modern semiconductor elements and, hence, imposes a serious problem from the standpoint of correcting the exposure. That is, the exposure dosage of the resist is given as the sum of incident electrons and the amount reflected electrons. Here, however, the amount of reflected electrons varies depending upon the size of the pattern and the density. Therefore, the effect of the reflected electrons is calculated for the individual patterns that are to be described in order to determine the amount of correction for both the exposure dosage and the pattern size to be exposed, thereby involving a series of cumbersome operations.

SUMMARY OF THE INVENTION

An object of the present invention is to provide a method for exposing substrates to an electron beam which is capable of describing fine patterns with high precision.

Another object of the present invention is to provide a method for exposing substrates to an electron beam which is capable of easily correcting the effect of the scattered electrons and the reflected electrons.

The above-mentioned objects can be achieved by an electron beam exposing method which projects an electron beam onto a desired region of a resist layer. An acceleration voltage of the electron beam is set at a value at which a distribution of scattered electrons in a predetermined region of the resist layer is substantially uniform and an exposure dosage is determined according to a ratio between a total area of the patterns to which the electron beam is projected in the predetermined region and the area of the predetermined region.

Further features and advantages of the present invention will be apparent from the ensuing description with reference to the accompanying drawings to which, however, the scope of the invention is in no way limited.

DESCRIPTION OF THE PREFERRED EMBODIMENT

Figure 1:
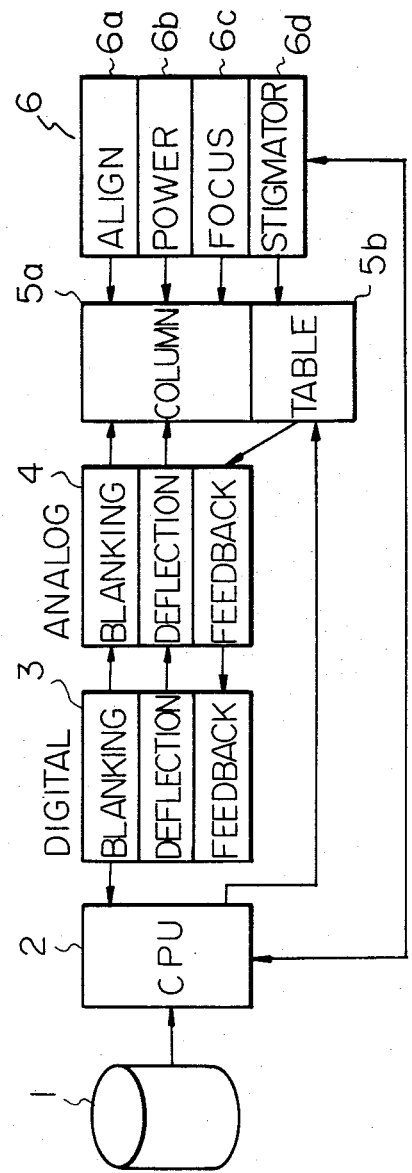
FIG. 1 is a block diagram of an electron-beam exposure system which is used in the method according to the present invention.

In the block diagram of the electron-beam exposure system shown in FIG. 1, a disk 1 contains pattern data and wafer maps. The wafer maps describe the pattern type and location on the wafer. The disk 1 also stores deflection paths, data tables, and programs for a computer 2.

Prior to writing, the computer 2 loads the deflection portion of a central processing unit with a description of the path of the electron beam. This description is read to a digital control unit 3 and is converted into analog form by an analog control unit 4 having control signals to generate magnetic and electrostatic deflection so as to supply deflection data to a column 5a. The computer 2 also accepts data from backscattering detectors in a table 5b, positioned at the base of the column 5a, for the purpose of registration and calibration. A column control 6 includes an alignment 6a for an optical axis, a source 6b for generating an acceleration voltage, and a focus adjust 6c and a stigmator 6d for an optical system.

When fine patterns are described by data stored in the disk 1 shown in FIG. 1, the effect of the reflected electrons must be satisfactorily corrected because the reflected electrons are scattered around the incidence point of the incident electrons.

Figure 2:
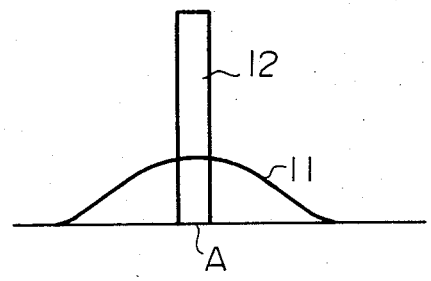
FIG. 2 is a diagram of the electric charge distribution in a conventional method of exposing workpieces to an electron beam.

FIG. 2 is a diagram of the intensity distributions of the incident electrons and reflected electrons in a conventional method of exposing workpieces. The electrons 11 reflected by the substrate are scattered around an incident point A where incident electrons 12 fall. The electron beam is usually accelerated at a voltage of about 20 to 25 KV. It is known that the scattering radius of the reflected electrons is about 2.5 $\mu$m when a voltage within the above-mentioned range is applied.

As has been mentioned, the above scattering radius is nearly equal to the pattern dimensions and pattern gaps of modern semiconductor elements and, hence, imposes a serious problem from the standpoint of correcting the exposure. Also, determination of the amount of correction for both the exposure dosage and the pattern size to be exposed is difficult.

The invention is described below by way of an embodiment. In this embodiment, the voltage for accelerating the electron beam is set at about 40 KV. When the acceleration voltage is high, the scattering length increases roughly in proportion to the square power of the acceleration voltage and becomes about 10 μm, i.e., the reflected electrons scatter over areas wider than the dimension of the pattern. The amount of electric charge of the reflected electrons at a given point A in the exposed field varies in proportion to the pattern density in a region which region has the point A as a center and a radius equal to the scattering length.

Figure 3:
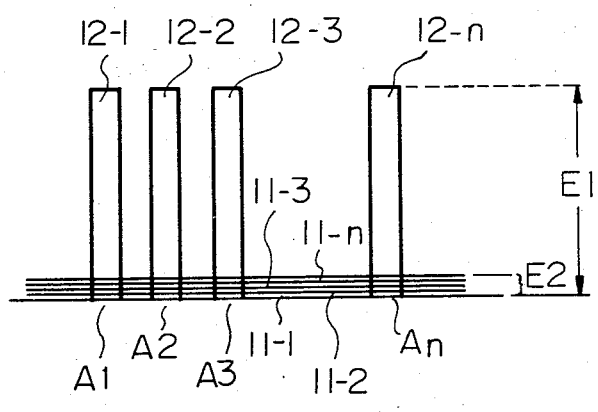
FIG. 3 is a diagram of the electric charge distribution in an embodiment of the present invention.

This state is diagrammed in FIG. 3, in which $A_1$, $A_2$, $A_3$, and $A_n$ denoted exposing positions, 12-1, 12-2, 12-3, and 12-n denote distribution of the electric charge by the incident electrons at the points $A_1$ to $A_n$, and 11-1, 11-2, 11-3 and 11-n denote distribution of the electric charge by the reflected electrons. In this embodiment, as illustrated in FIG. 3, the electric charge of each of the reflected electrons at a given point, for example, at the point $A_1$, is affected by the reflected electrons of not only the neighboring sections such as the points $A_2$ and $A_3$ but also by the reflected electrons at a relatively remote point such as point $A_n$. The amount of electric charge of each of the reflected electrons, however, is small and is nearly the same value as that of the incident electrons if the density $E_1$ of the incident electrons of each beam spot is constant. The sum is proportional to the sum of the areas of the patterns described in the region relative to the area of the region which has a radius equal to the scattering length (about 10 μm) and a center positioned at the point $A_1$.

In other words, if attention is given to a narrow section, the density $E_2$ of the electric charge of each of the reflected electrons can be regarded as being approximately the same at every point in this small section. In this small section, therefore, the pattern should be described by determining the correction amount relative to the density $E_1$ of the incident electrons so that the density $E_2$ of the electric charge of each of the reflected electrons becomes negligibly small with respect to the sensitivity of the resist.

In this embodiment, the exposure is corrected based upon the above-mentioned mechanism. The method is described below.

Figure 4:
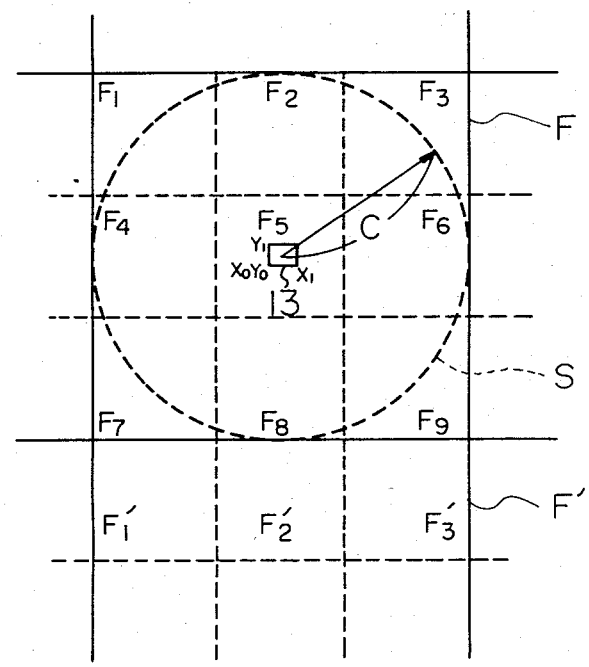
FIG. 4 is a diagram of a top view of sub-fields in an embodiment of the present invention.

To describe the pattern by exposing the substrate to an electron beam, the ordinary region of exposure is divided into a multiplicity of sub-fields and exposure is effected for each sub-field. In FIG. 4, the symbols F and F' denote the sub-fields.

FIG. 4 is an example in which the sub-fields F and F' have a side that is nearly equal to twice the scattering length C. In such a case, the sides of the sub-fields are equally divided into three portions and then each of the portions is divided into three small sections, thereby forming the nine small sections $F_1$ to $F_9$.

Among the above-mentioned small sections, the amount of electric charge of the reflected electrons at every point in the small central section $F_5$ varies depending solely upon the pattern density in a region S that is, the circle having a radius equal to the scattering length C, as is obvious from the foregoing description. Therefore, the small section $F_5$ is exposed to the electron beam while correcting the exposure dosage on the basis of the pattern density in the regions. In practice, furthermore, the exposure dosage may be corrected relying upon the pattern density in the subfield F instead of the pattern density in the region S.

Other small sections, except for the small section $F_5$, are located in the periphery of the sub-field F and the region S and are affected by the neighboring sub-fields. Therefore, a region with the scattering length C as a radius surrounds the small sections, and the exposure dosage is determined on the basis of the pattern density in the region with the radius of scattering length C. The exposure dosage for the small sections is corrected on the basis of the average pattern density of the small sections and the neighboring small sections.

For example, in the case of the small section $F_8$, an average pattern density is found in the lower, upper, left, and right sections $F'_2$, $F_5$, $F_7$, and $F_9$ and in the small sections $F_4$, $F_6$, $F'_1$, and $F'_3$ at the four corners. The amount of correction is determined on the basis of the average value.

To correct the exposure as mentioned above, the amount of correction is calculated for each of the small sections, the data for specifying the corrected exposure quantity is stored in a program for describing the pattern, and exposure is effected according to the program for describing the pattern. The pattern density for each small section is prepared together with the pattern data, and the amount of correction is calculated each time from the pattern density data for each of the small sections.

Next, the electron-beam exposing method which is applied to a variable rectangular pattern 13 shown in FIG. 4 is explained. In the pattern 13, the pattern data for electron-beam exposure has an original point ($X_0$, $Y_0$), and the dimension of the pattern data is expressed as ($X_1$, $Y_1$).

The amount of correction required for exposure is determined as the dose amount (C/cm$^2$) from the resist sensitivity characteristic. If we assume that this dose amount is D(C/cm$^2$), the projection time of the electron beam is t(sec), and the beam current is A(A/cm$^2$). The projection time necessary for the electron beam is expressed by $$t = D/A \text{(sec)}$$

In the present invention, the exposure time is changed when the pattern data is changed, and a computer separated from the exposure system calculates a correction factor $\alpha_t$ for the exposure time which is required for all pattern data by using the algorithm given below. That is, for exposure, the electron beam is exposed for the exposing time expressed as $$t \cdot \alpha_t \text{(sec)}$$

Therefore, the pattern data in which the correction factor is included is expressed by $$X_0, Y_0, X_1, Y_1, \alpha_{ti}$$

The value of $\alpha_{ti}$ is determined as follows:

(a) At first, all patterns are included in a circle having a center of ($X_{0i}$, $Y_{0i}$), an approximation for the center of the patterns, and a radius of C. Strictly, the center of the patterns should coincide with the center of the circle. However, as the patterns are very small, the original points ($X_{0i}$, $Y_{0i}$) are used as the center of the circle.

(b) A value s is calculated as $$\sum_{n \in S} X_{In} \cdot Y_{In} = s$$

The value s is the sum of the patterns included in the circle having "i" as a center and "C" as a radius.

(c) Finally, $\alpha_{ti}$ is determined as the value $$\alpha_{ti} = 1 - \frac{s}{4C^2} \Delta$$

wherein $\Delta$ is the amount of reflected electron beams when the whole surface is exposed, and in a silicon wafer, this value is about 0.3.

According to the present invention as mentioned above, the voltage for accelerating the electron beam is set so that it is greater than 40 KV, and the procedure is carried out in the conventional manner with the exception of suitably selecting the magnetomotive force of the lens of the column and suitably selecting the deflection current. Namely, the pattern can be described by simply changing the portion of the program which controls exposure, as mentioned above.

In the present invention as described above, the voltage for accelerating the electron beam is set so that it is greater than 40 KV in order to increase the scattering length, with the result that the effect of the reflected electrons is minimized and made uniform in the predetermined small sections. Consequently, the exposure is uniformly corrected for each of the small sections, requiring a very simple operation. Further, since the effect of the reflected electrons is eliminated, no error occurs in the dimension of the pattern, thereby obviating the need for correcting the pattern size to be exposed.

We claim:

1. An electron beam exposing method for projecting an electron beam, having an accerleration voltage, onto a desired region of a resist layer having a predetermined region having an area and having patterns, comprising the steps of:

(a) setting the acceleration voltage of the electron beam to a value at which a distribution of scattered electrons in the predetermined region of the resist layer is substantially uniform;

(b) projecting the electron beam onto the resist layer at an exposure dosage determined according to a ratio between a total area of the patterns onto which the electron beam is projected in the predetermined region with respect to the area of the predetermined region, said projecting step comprising the substeps of:

(i) determining an exposure dosage time in dependence upon a dose amount and an electron beam current;

(ii) calculating a correction factor to obtain a corrected exposure dosage time, comprising the substeps of:

(aa) determining a radius and center for a circle including the patterns;

(bb) calculating a sum of the areas of the patterns in the circle; and (cc) calculating the correction factor for the exposure dosage time in dependence upon electrons reflected from the entire surface of the resist layer, the radius of the circle and the sum of the areas of the patterns in the circle; and (iii) correcting the exposure dosage time in dependence upon the correction factor to obtain the corrected exposure dosage time.

2. An electron beam exposing method according to claim 1, wherein said step of setting the acceleration voltage of the electron beam comprises setting the acceleration voltage to at least 40 KV.

3. An electron beam exposing method according to claim 1, wherein the predetermined region is a circular area having a center region and a radius equal to a scattering length of the electrons in the electron beam, said method further comprising the step of projecting the electron beam onto the center region.

* * * * *

UNITED STATES PATENT AND TRADEMARK OFFICE
CERTIFICATE OF CORRECTION

PATENT NO. : 4,500,789

DATED : February 19, 1985

INVENTOR(S) : BAN et al.

It is certified that error appears in the above-identified patent and that said Letters Patent is hereby corrected as shown below:

Col. 1
Line 49, before "incident" insert --the amount of--;
Line 49 delete "the amount".

Col. 3
Line 13, delete "region" (second occurrence).

Signed and Sealed this

Twenty-seventh Day of August 1985

[SEAL]

Attest:

DONALD J. QUIGG

Attesting Officer     Acting Commissioner of Patents and Trademarks